US007835415B2

(12) United States Patent
Behfar et al.

(10) Patent No.: US 7,835,415 B2
(45) Date of Patent: Nov. 16, 2010

(54) SINGLE LONGITUDINAL MODE LASER DIODE

(75) Inventors: Alex A. Behfar, Ithaca, NY (US); Kiyofumi Muro, Chiba (JP); Cristian B. Stagarescu, Ithaca, NY (US); Alfred T. Schremer, Freeville, NY (US)

(73) Assignee: BinOptics Corporation, Ithaca, NY (US)

( * ) Notice: Subject to any disclaimer, the term of this patent is extended or adjusted under 35 U.S.C. 154(b) by 999 days.

(21) Appl. No.: 10/929,718

(22) Filed: Aug. 31, 2004

(65) Prior Publication Data

US 2005/0147145 A1    Jul. 7, 2005

Related U.S. Application Data

(60) Provisional application No. 60/499,340, filed on Sep. 3, 2003.

(51) Int. Cl.
*H01S 3/03* (2006.01)
(52) U.S. Cl. .................... 372/64; 359/590; 359/588; 359/578; 359/577
(58) Field of Classification Search .......... 372/64; 385/130–132; 359/590, 588; 356/454, 519, 356/506
See application file for complete search history.

(56) References Cited

U.S. PATENT DOCUMENTS

| 5,150,236 | A | * | 9/1992 | Patel | 349/198 |
| 5,185,842 | A | * | 2/1993 | Hakogi | 385/129 |
| 6,215,592 | B1 | | 4/2001 | Pelekhaty | |
| 6,324,192 | B1 | | 11/2001 | Tayebati | |
| 6,654,564 | B1 | * | 11/2003 | Colbourne et al. | 398/147 |
| 6,741,624 | B2 | * | 5/2004 | Mears et al. | 372/45.01 |
| 6,879,619 | B1 | * | 4/2005 | Green et al. | 372/98 |
| 7,061,946 | B2 | * | 6/2006 | Sochava et al. | 372/20 |
| 7,209,498 | B1 | * | 4/2007 | Chapman et al. | 372/20 |
| 2002/0054614 | A1 | * | 5/2002 | Jin | 372/20 |
| 2002/0081073 | A1 | | 6/2002 | Lee et al. | |
| 2002/0175334 | A1 | | 11/2002 | Herold | |
| 2002/0196549 | A1 | * | 12/2002 | Randall et al. | 359/578 |
| 2003/0179788 | A1 | * | 9/2003 | Wildeman et al. | 372/20 |
| 2004/0070834 | A1 | * | 4/2004 | Hendrix et al. | 359/577 |
| 2005/0030545 | A1 | * | 2/2005 | Tuschel et al. | 356/454 |

OTHER PUBLICATIONS

Behfar-Rad et al, "Monolithic A1GaAs-GaAs Single Quantum-Well Ridge Lasers Fabricated with Dry-Etched Facets and Ridges," IEEE Journal of Quantum Electronics, vol. 28 (No. 5), p. 1227-1231, (May 21, 1992).
International Search Report from International Application No. PCT/US04/25601 mailed May 4, 2005.

* cited by examiner

*Primary Examiner*—Minsun Harvey
*Assistant Examiner*—Delma R Forde
(74) *Attorney, Agent, or Firm*—Jones, Tullar & Cooper, P.C.

(57) ABSTRACT

A single-mode, etched facet distributed Bragg reflector laser includes an AlGaInAs/InP laser cavity, a front mirror stack with multiple Fabry-Perot elements, a rear DBR reflector, and a rear detector. The front mirror stack elements and the rear reflector elements include input and output etched facets, and the laser cavity is an etched ridge cavity, all formed from an epitaxial wafer by a two-step lithography and CAIBE process.

11 Claims, 4 Drawing Sheets

SINGLE LONGITUDINAL MODE LASER DIODE

This application claims the benefit of U.S. Provisional Application No. 60/499,340, filed Sep. 3, 2003, the disclosure of which is hereby incorporated herein by reference.

BACKGROUND OF THE INVENTION

The present invention relates, in general, to improved single longitudinal mode laser diodes and to methods for producing the same.

Single mode lasers with a high side-mode suppression ratio (SMSR) are key devices for many applications, including, for example, spectroscopy, sensing and optical communications. To date, so-called distributed feedback (DFB) lasers, distributed Bragg reflector (DBR) lasers, and vertical cavity surface-emitting lasers (VCSEL) have been exclusively used for such applications. However, the fabrication of laterally coupled DBR lasers and the fabrication of buried heterostructure DFB lasers require the use of sophisticated fabrication techniques. The sub-micron e-beam or focused ion beam lithography processes used for DBR lasers are not desirable for mass production because of their serial nature, and the delicate crystal re-growth processes needed to fabricate the corrugated surface in DFB lasers make them unsuitable. These sophisticated processes inevitably give low yield and high cost for the production of these lasers, so there has been a strong demand for more cost-effective single mode lasers, especially for use in the growing fields of data-communications. In addition, VCSELs suffer from their inability to provide high power because of their short cavities.

Presently available devices also require cooling for proper operation, and the need to provide heat dissipation apparatus increases their total cost. Therefore, there is a strong desire for SMSR laser devices that do not require cooling. It is well known that laser diodes made of AlGaInAs/InP material present better high temperature performance compared to conventional InGaAsP/InP material in the fiber communication wavelengths around 1550 nm and 1310 nm. However, the Al-containing material makes the previously used regrowth fabrication process extremely difficult and unreliable because of Al oxidation. Accordingly, a new structure or a new fabrication method that is compatible with AlGaInAs/InP is strongly desired for the development of single mode laser diodes that do not require cooling.

In the 1980s extensive efforts were devoted to coupled-cavity lasers to get single mode operation; for example, see Larry Coldren et al. IEEE Journal of Quantum Electronics, QE-20, p-659 (1984). However, mode discrimination was not strong enough in the coupled cavity scheme and it was difficult to get high SMSR under modulation. Also, it was impossible to keep a high SMSR over the wide temperature range (0-85 deg. C.) that is expected for uncooled operation.

SUMMARY OF THE INVENTION

In accordance with the present invention, novel, multiple-section, coupled-cavity single mode laser diodes with high SMSR are provided by a cost-effective fabrication process. These lasers maintain their high SMSR over a wide temperature range and under modulation. These lasers are fabricated through the use of established microelectronics manufacturing processes such as optical lithography and CAIBE on an epitaxial wafer, which processes are easily applicable to Al-containing materials like AlGaInAs/InP, since crystal regrowth is not necessary.

In one example of a preferred form of the invention, a single-mode, etched-facet distributed Bragg reflector laser is fabricated by successively forming, on an n-type (100) InP wafer, an n-InP cladding layer, an n-AlGaInAs SCH (separate confinement heterostructure) layer, AlGaInAs strained multi-quantum well active layers, a p-AlGaInAs SCH layer, a p-InP cladding layer, and a highly doped p-InGaAs contact layer. The active region consisted of, for example, 6 compressively strained quantum wells and 7 tensile barrier layers, and the band gap of the quantum well was around 1300 nm. Two steps of chemically assisted ion-beam etching (CAIBE) were carried out using a $SiO_2$ mask, patterned by lithography. The facet was formed by the first CAIBE step, and then a ridge waveguide was formed by the second CAIBE step. Electrodes were formed on the top of the ridge and the bottom of the wafer. The ridge structure was planarized with polyimide and a bonding pad was formed. The depth of the facet was around 4 μm and the ridge height was around 1.8 μm. The ridge width was typically 3 μm and the ridge had 3 μm shoulders on both sides.

With this ridge waveguide structure a stable single lateral mode operation was obtained beyond 100 mA. The farfield pattern of the output beam was typically 36 and 10 deg. (FWHM), respectively, for vertical and horizontal directions. A monitor photodiode was integrated in the rear of the structure, but did not have a ridge structure. At the rear and the forward ends, Fabry-Perot waveguide blocks are fabricated to provide suitable filtering. The device is energized to produce laser operation, with the spacing of the front waveguide blocks operating as a distributed Bragg reflector, while the rear waveguide blocks operate as a DBR reflector.

The foregoing structure and fabrication method provide a cost-effective solution for producing single mode laser diodes with a high SMSR. The devices so fabricated are single mode lasers that are stable for a wide temperature range without the need for cooling, and since the fabrication process does not include crystal regrowth, it is compatible with Al-containing material like AlGaInAs/InP, which has superior temperature performance.

BRIEF DESCRIPTION OF THE DRAWINGS

The foregoing, and additional objects, features and advantages of the present invention will be apparent to those of skill in the art from the following detailed description of preferred embodiments thereof, taken in conjunction with the accompanying drawings, in which.

DESCRIPTION OF PREFERRED EMBODIMENTS

Figure 1:
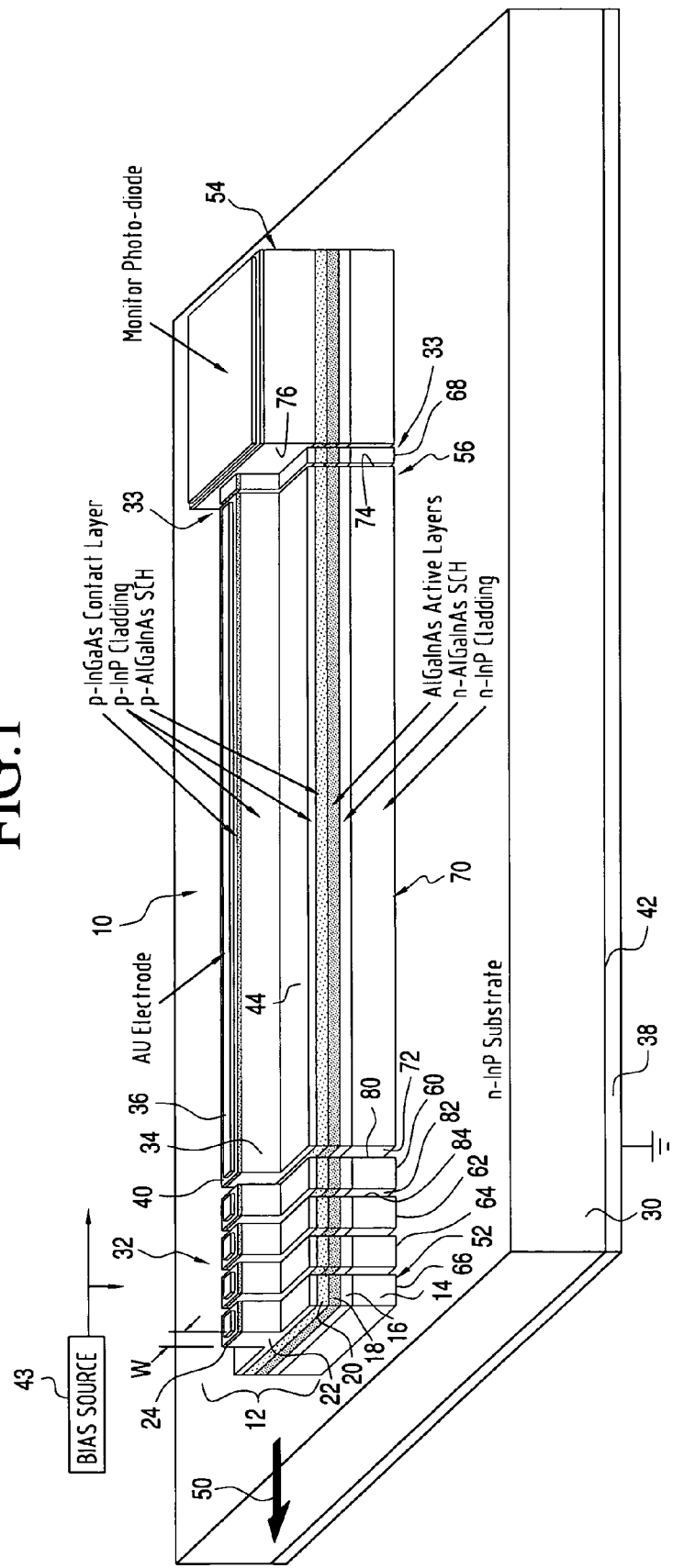
FIG. 1 is a three-dimensional schematic diagram of a preferred embodiment of the present invention.

Turning now to a more detailed description of the invention, there is illustrated in FIG. 1 a three-dimensional schematic diagram of a preferred embodiment of a single-mode laser 10 fabricated from an epitaxial wafer 12.

In a device constructed in accordance with this first embodiment, the wafer 12 was fabricated with an n-InP cladding layer 14, an n-AlGaInAs SCH (separate confinement heterostructure) layer 16, AlGaInAs strained multi-quantum well active layers 18, a p-AlGaInAs SCH layer 20, a p-InP cladding layer 22 and a highly doped p-InGaAs contact layer 24, formed successively on an n-type (100) InP wafer 30. The active region 18 consisted of, for example, six 6 nm compressively strained AlGaInAs quantum wells separated by 10 nm tensile-strained AlGaInAs barrier layers; the band gap of the quantum well was about 1300 nm.

The laser 10 was formed from the epitaxial wafer 12 by two steps of chemically-assisted ion-beam etching (CAIBE), which were carried out using an $SiO_2$ mask, patterned by lithography in conventional manner. Multiple blocks 32 and 33 (to be described) were formed along the longitudinal axis of the laser 10, at its front and back ends, respectively, by the first CAIBE step, and then a ridge waveguide 34 was formed in layer 22 by the second CAIBE step. Metal electrodes 36 and 38 were formed on the top surface 40 of the ridge 34 and the bottom surface 42 of the wafer. The resulting ridge structure was planarized with polyimide, and bonding pads were formed on the electrodes for connection to a suitable bias source 43.

In examples of the laser 10 fabricated as described above, the depth of the blocks 32 and 33 was about 4 μm and the height of ridge 34 was about 1.8 μm. The width w of ridge 34 was typically 3 μm, and the ridge had 3 μm wide shoulders 44 on both sides. With this ridge waveguide structure, a stable single lateral mode operation was obtained beyond 100 mA. The far-field pattern of the output beam 50 emitted from the front end 52 of the laser was typically 36 and 10 deg. (FWHM), respectively, for vertical and horizontal directions. A monitor photodiode 54 was integrated at the back end 56 of the laser to detect laser operation; usually the detector does not have the ridge structure of the laser.

Figure 2:
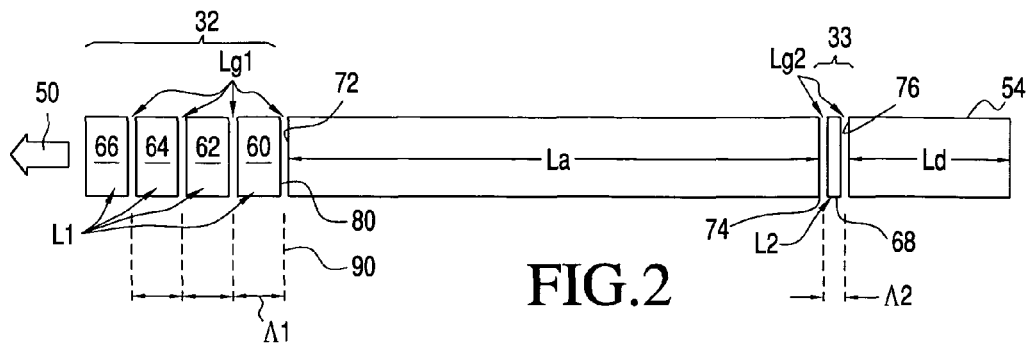
FIG. 2 is a diagrammatic side elevation of the embodiment of FIG. 1.

As illustrated in FIGS. 1 and 2, the laser 10 was fabricated with multiple blocks 32 forming a front mirror stack, or reflector, and at least one block 33 forming a back, or rear, DBR reflector. The blocks are formed during the first CAIBE step to produce N Fabry-Perot elements such as elements 60, 62, 64 and 66 forming the front mirror stack 32, and a rear reflector element 68, formed by block 33. As illustrated in FIG. 2, each of the front reflector elements 60, 62, 64 and 66 has a length L1, and each is spaced apart from adjacent elements and from the cavity portion 70 of the laser 10 by air gaps Lg1. The rear reflector element 68 has a length L2 and is spaced from cavity portion 70 and from monitor 54 by air gaps Lg2. The main cavity portion is a monolithic laser cavity of length La, with each end of the laser cavity being defined by a corresponding one of facets 72 and 74. Each end of elements 60, 62, 64, 66 and 68 is similarly defined by a corresponding facet, and the input to MPD or monitor photodetector 54, which has a length Ld, is defined by an input facet 76. Reflection from the input facet 76 of the monolithic detector 54 modifies the reflectivity of the rear reflector element 68.

The elements in the front reflector 32 are biased by source 43 in parallel with the gain section, or main body 70, of the laser, while the single rear DBR element is not biased and the MPD is reverse biased.

All embodiments of the invention have a three-dimensional structure similar to that of FIG. 1, but each device can be characterized by one-dimensional parameters; i.e., the number (N) and the thickness (L1) of the front Fabry-Perot waveguide blocks 32 and their spacing (Lg1), and the number (M) and thickness (L2) of the rear Fabry-Perot (FP) waveguide blocks 33 and their spacing (Lg2), as will be discussed below.

As illustrated in the schematic diagram of the first embodiment of the present invention in FIG. 2, specific device parameters in one implementation of the invention were N=4, L1=5.16 μm, Lg1=1.31 μm, M=1, L2=0.74 μm, Lg2=0.98 μm, La=200 μm and Ld=100 μm. The gap, or spacing of the elements 60, 62, 64, and 66 of the front FP waveguide block 32 was set to be Lg1=λ, where λ is the wavelength of light generated by laser 10. In this configuration, light is partially reflected within the cavity 70 by end facets 72 and 74. Light which exits the front end of the cavity through facet 72 is transmitted across space Lg1, is partially reflected by input facet 80 of element 60, and is partially transmitted through the element to its output facet 82, where it is partially reflected, and partially transmitted to the input facet 84 of the next element 62. Similarly, the light is partially reflected and partially transmitted by the input and output facets of each of the elements of mirror stack 32, and is finally emitted as beam 50.

A key feature of this device is that the gap Lg1 of the front reflector elements 60, 62, 64 and 66 is mλ/2, where m is an integer, with a pitch of Λ1 in this configuration, the reflections from each pair of facets facing each other across each gap, such as facets 72 and 80, facets 82 and 84, and so on, will be out of phase and will cancel each other. Since this waveguide mode has a diffraction loss in each gap, the cancellation is not perfect, leading to a net weak reflection with an effective reflection plane 90 in the gap between the two facets. Distributed gaps with a thickness of mλ/2 in the FP waveguide block behave as a weak distributed Bragg reflector. The best results are obtained when the gap Lg1 substantially equal to mλ/2 or mλ/2±λ/10.

Weak reflection is essential to form a narrow band filter. In fact, the facet field reflectivity, r=(n−1)/(n+1) of semiconductor materials is fairly high, typically around 0.5, because of the high material index, n. Gaps of length (2m+1)λ/4 in a conventional DBR configuration have an effective reflectivity of 0.83, corresponding to constructive reflection off two semiconductor-air interfaces. In that case, two DBR elements are sufficient to make a high reflector, but the reflection spectrum is broad-band with low finesse. For the present device, the front reflector 32, the gap width is mλ/2 and has an effective reflectivity approximated by $r/(1-r^2)\alpha(m\lambda/2)$, where α is a parameter that describes the diffraction loss of the waveguide mode in the gap, where α and the effective reflectivity are estimated to be 0.2 $\mu m^{-1}$ and 0.20, respectively.

Figure 3:
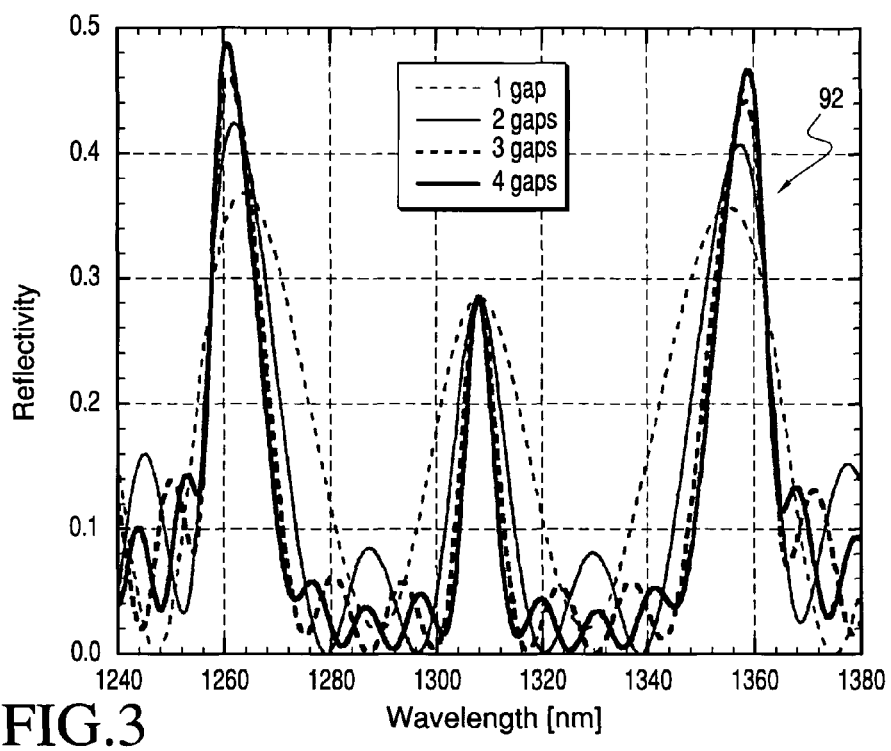
FIG. 3 illustrates the reflection spectra of the front reflector of the device of FIG. 1.

FIG. 3 illustrates, at 92, the results of a one dimensional scattering matrix model used to calculate the power reflected by the front DBR 32 into the laser cavity, or gain section 70. In the model the effective modal index is 3.3, and the diffraction loss parameter α is 0.2 μm$^{-1}$. The free spectral range (FSR) is determined by the pitch Λ1, and the finesse increases with the number of gaps. Two-dimensional finite-difference time-dependent (FDTD) calculations, using the R-Soft program, based on the real epitaxial layer structure predict a small spectral change in the result, but the essential features are similar to the scattering matrix analysis. For the case of one gap, corresponding to a conventional coupled-cavity laser, the finesse is not high, resulting in lasers with poor SMSR. This is quite different from that of multiple microcavity lasers where each segment is optically isolated with a gap of (2j+1)λ/4 thickness, where j is an integer. Accordingly, a high finesse reflection filter, of which free spectral range is defined by the effective length of the pitch, is provided. Based on this design concept, device parameters are carefully determined by the simulation of the scattering matrix and by the FDTD (finite-difference time-domain) based simulation program by R-Soft.

Figure 4:
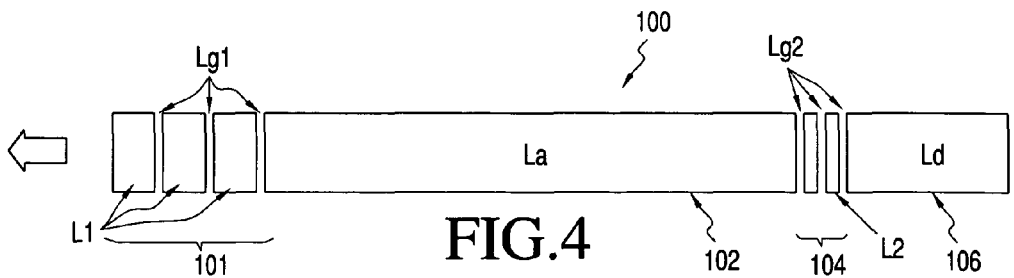
FIG. 4 is a diagrammatic side elevation of a second embodiment of the present invention.

FIG. 4 is a one-dimensional schematic diagram of a second embodiment of the present invention. In this embodiment, the laser 100 includes a front reflector 101 having three elements, a main cavity 102, a rear reflector 104, and a monitor 106. The specific parameters of a device fabricated in accordance with this configuration were N=3, L1=8.06 μm, Lg=1.31 μm, M=2, L2=4.08 μm, Lg2=0.98 μm, La=200 μm and Ld=100 μm. In this design, the FSR of the front reflector structure 100 was ~28 nm. With these parameters, a mode jump into the neighboring filter peak will occur every 70 deg. C., because the temperature dependence of the gain peak and the resonant mode are 0.5 nm/C and 0.1 nm/C, respectively. This is not good enough for an uncooled device, which is expected to be single mode operation in the temperature range 0-85 deg.C. Accordingly, the rear DBR reflector 104 was carefully designed to give reflection dips on the neighboring filter peaks of the front FP structures in order to suppress the mode jump. In this example, the rear FP thickness was selected to be around half that of the front FP.

Figure 5:
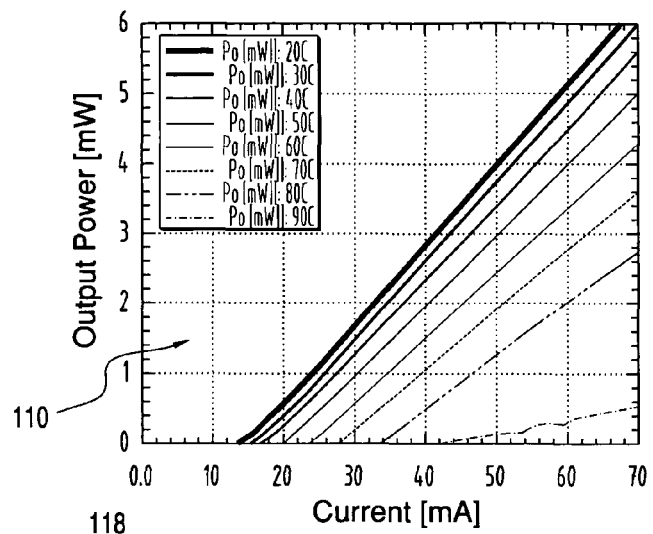
FIG. 5 is a graphical illustration of light-current curves at various temperatures for the embodiment of FIG. 1.

FIG. 5 shows the light-current curves 110 of the embodiment of FIGS. 1 and 2 at various temperatures, ranging from 20° C. to 90° C. Laser diodes in accordance with this embodiment showed kink-free operation in the temperature range of 20-80 deg.C. As illustrated, the threshold current was 14 mA and the slope efficiency was 0.12 W/A at 20° C., and was 33 mA and 0.08 W/A, respectively, at 80° C. The modest temperature dependence of the threshold current and slope efficiency were ascribed to the Al-containing strained quantum well.

Figure 6:
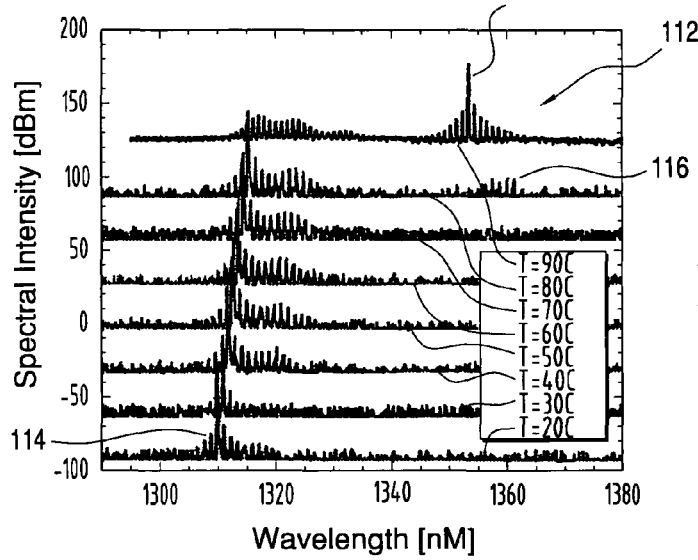
FIG. 6 is a graphical illustration of the temperature dependence of lasing spectra for the embodiment of FIG. 1, observed at 60 mA.

FIG. 6 shows the temperature dependence curves 112 of lasing spectra for the 4-gap device of FIGS. 1 and 2, observed at 60 mA. The lasing peak was locked in the same mode in the temperature range of 20-80 deg.C. As illustrated, the lasing peak 114 shifts toward longer wavelengths as the temperature increases, at a rate of 0.1 nm/° C., with no mode hops over the entire temperature range from 20° C. to 80° C. The gain peak shift was measured to be 0.5 nm/° C. for the material of this example, which corresponds to a 30 mm shift for a temperature excursion of 60° C. As the gain peak moved toward longer wavelengths, as at a temperature of 80° C., the curves begin to show evidence of the next DBR reflection peak at 116, occurring at 1360 nm, or about 50 nm from the peak. A 40 nm jump for the peak was observed at 90° C., as illustrated at 118.

Figure 7:
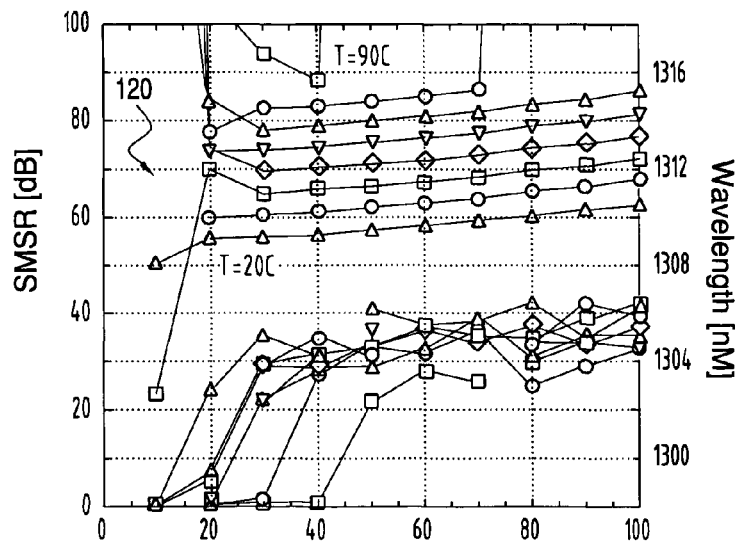
FIG. 7 is a graphical illustration of the peak wavelength and SMSR for the embodiment of FIG. 1, as a function of current at various temperatures.

FIG. 7 shows at curves 120 the peak wavelength and SMSR for the device of FIGS. 1 and 2 as a function of current at various temperatures. Lasing occurred at the same mode except for the high temperature and high current region. Also high SMSR (25-40 dB) was obtained except near threshold.

Figure 8:
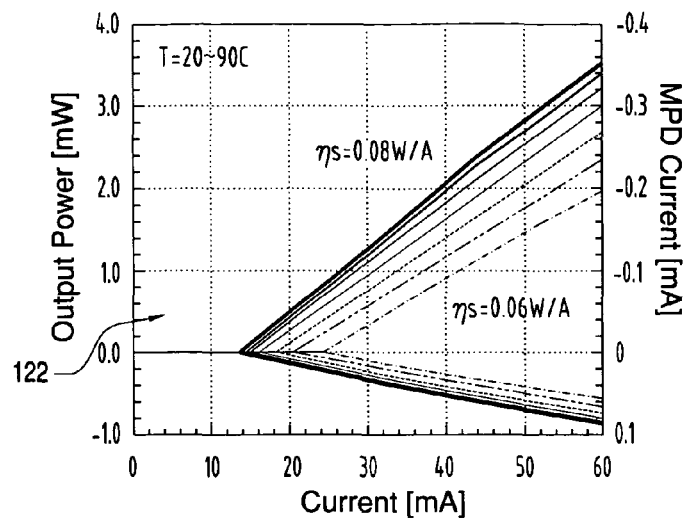
FIG. 8 is a graphical illustration of Light vs. Laser Current curves and MPD Current vs. Laser Current curves for the embodiment of FIG. 4, at various temperatures.

FIG. 8 shows the light-current curves 122 of the embodiment of FIG. 4 at various temperatures. Laser diodes in this embodiment showed kink-free operation in the temperature range of 20-90 deg.C. Modest temperature dependence of the threshold current and slope efficiency were ascribed to the Al-containing strained quantum well.

Figure 9:
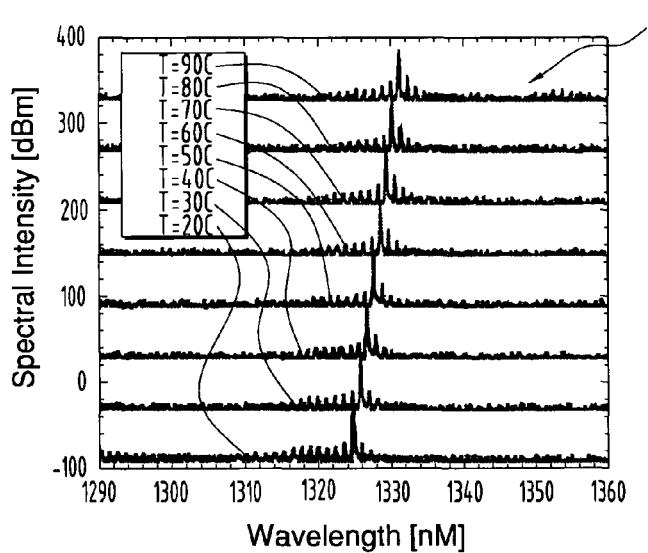
FIG. 9 is a graphical illustration of the temperature dependence of lasing spectra for the embodiment of FIG. 4, observed at 60 mA.

FIG. 9 illustrates at curves 124 the temperature dependence of lasing spectra for the embodiment of FIG. 4, observed at 50 mA. The lasing peak was locked in the same mode over the entire temperature range of 20-90 deg.C. The peak wavelength shift was 0.1 nm/deg. C., similar to a corresponding DFB laser. The gain peak shift was 0.5 nm/deg. C. The free spectral range of the front-stacked 8.06 μm FP filter was around 28 nm. The corresponding mode jump was suppressed by the rear DBR reflector by designing the appropriate thickness, which in this case was 4.08 μm.

Figure 10:
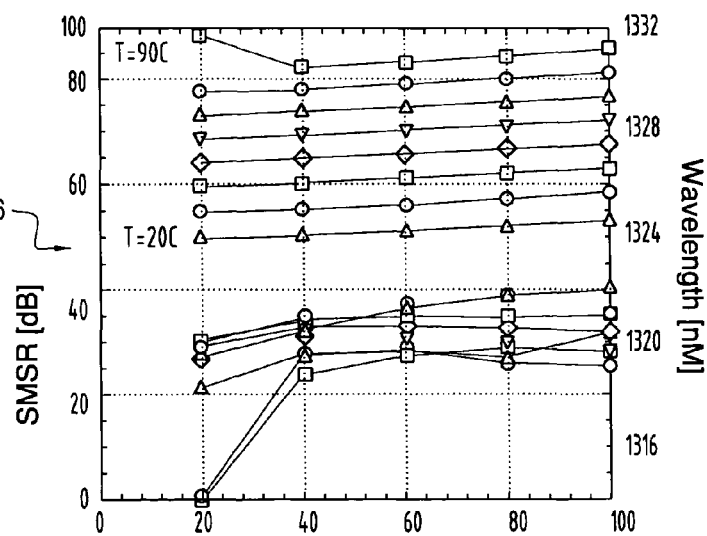
FIG. 10 is a graphical illustration of the peak wavelength and SMSR of the embodiment of FIG. 4, as a function of current at various temperatures.

FIG. 10 shows by curves 126 the peak wavelength and SMSR of the embodiment of FIG. 4 as a function of current at various temperatures. Lasing occurred at the same mode over the entire temperature and current range. Also, high SMSR (25-40 dB) was obtained except near threshold.

Figure 11:
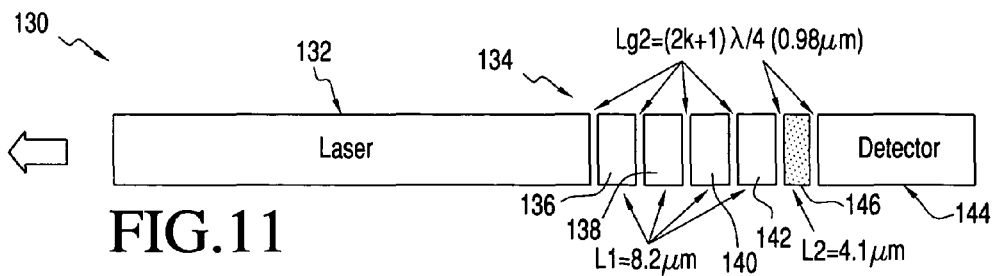
FIG. 11 is a diagrammatic side elevation of a third embodiment of the present invention.

FIG. 11 illustrates at 130 a third embodiment of the invention, wherein the front reflector stack for the laser cavity 132 is eliminated, and wherein a rear stack 134 includes four high-reflection FP elements 136, 138, 140 and 142, each having a length L1 of about 8.2 μm forming a narrow-band stacked FP filter. Between the stack 134 and a monitor photodetector 144, is a narrow FP filter element 146 having a length L2 equal to about 4.1 μm. The gaps Lg2 between the filter elements have a width of (2k+1)λ/4, where k is an integer, or in this embodiment, about 0.98 μm. The quarter-wave gaps provide a narrow band, high reflection filter that results in higher slope efficiency.

Although the present invention has been described in terms of preferred embodiments, variations and modifications may be made without departing from the true spirit and scope of the invention, as defined in the following claims.

What is claimed is:

1. A lithographically formed stacked Fabry-Perot optical waveguide filter for laser light having a wavelength λ, said filter being formed on an epitaxial semiconductor wafer and comprising multiple Fabry-Perot optical waveguide filter elements, each being separated from one another by a corresponding one of multiple gap elements, each of said gap elements having a length of mλ/2±λ/10, where m is a positive integer and is selected so that a gap element has an effective reflectivity of no more than 0.2.

2. The lithographically formed stacked Fabry-Perot waveguide filter of claim 1, wherein each of said filter elements has the same length.

3. A semiconductor diode laser, comprising:
   a laser waveguide lithographically formed on an epitaxial semiconductor wafer, said laser waveguide having an axis;
   a lithographically formed stacked Fabry-Perot optical filter on said axis, said filter being integrally formed on said epitaxial semiconductor wafer on a front end of said laser waveguide and comprising multiple Fabry-Perot optical waveguide filter elements, each being separated from one another by a corresponding one of multiple gap elements, each of said gap elements having a length which is substantially a multiple of the half-wavelength of light within said gap elements and a gap element has an effective reflectivity of no more than 0.2.

4. The semiconductor diode laser of claim 3, wherein each of said filter elements has a length in the range of 2-10 μm.

5. The semiconductor diode laser of claim 3, further including a high DBR reflector element at a rear end of said waveguide.

6. The semiconductor diode laser of claim 5, wherein said rear high DBR reflector includes a reflector dip which coincides with a neighboring reflection peak for said stacked Fabry-Perot filters.

7. The semiconductor diode laser of claim 5, wherein each of said Fabry-Perot optical waveguide filter elements has a thickness that is twice as large as a thickness of said high DBR reflector element.

8. The semiconductor diode laser of claim 4, wherein each of said gap elements has a length that is smaller than the length of said filter elements.

9. The lithographically formed stacked Fabry-Perot wave-guide filter of claim 1, wherein each of said filter elements has a length in the range of 2-10 μm.

10. The lithographically formed stacked Fabry-Perot wave-guide filter of claim 9, wherein each of said gap elements has a length that is smaller than the length of said filter elements.

11. The lithographically formed stacked Fabry-Perot wave-guide filter of claim 1, wherein m is selected to be 2.

* * * * *